United States Patent [19]
Usuki

[11] Patent Number: 5,471,149
[45] Date of Patent: Nov. 28, 1995

[54] HIGH-SPEED LARGE OUTPUT AMPLITUDE VOLTAGE LEVEL SHIFTING CIRCUIT

[75] Inventor: Hideki Usuki, Kanagawa, Japan

[73] Assignee: Sony Corporation, Tokyo, Japan

[21] Appl. No.: 300,220

[22] Filed: Sep. 6, 1994

[30] Foreign Application Priority Data

Sep. 27, 1993 [JP] Japan .................. 5-240179

[51] Int. Cl.$^6$ .................................. H03K 19/094
[52] U.S. Cl. .................................. 326/68; 326/71
[58] Field of Search .................. 326/68, 70, 71, 326/81

[56] References Cited

U.S. PATENT DOCUMENTS

| | | |
|---|---|---|
| 3,879,621 | 4/1975 | Cavaliere et al. .............. 307/279 |
| 4,161,663 | 7/1979 | Martinez ........................ 326/68 |
| 4,561,702 | 12/1985 | McAdams ...................... 326/68 |
| 4,876,466 | 10/1989 | Kondou et al. ................ 326/68 |
| 4,920,284 | 4/1990 | Denda ........................ 326/68 X |
| 5,070,262 | 12/1991 | Hashimoto ................ 326/68 X |
| 5,332,936 | 7/1994 | Nakao ........................... 326/68 |

Primary Examiner—David R. Hudspeth
Attorney, Agent, or Firm—Ronald P. Kananen

[57] ABSTRACT

A voltage level shifting circuit which enables realization of high sensitivity input, high speed, and large output amplitude with a low power consumption, wherein a flipflop is constituted by two CMOS inverters, $INV_1$ and $INV_2$, the power voltage sides of the CMOS inverters are used as the inputs of the signals, transfer gates are connected between the input terminals of the input signals and the input terminals of the CMOS inverters, and the transfer gates are turned on and off by the same clock signal CLK.

5 Claims, 9 Drawing Sheets

HIGH-SPEED LARGE OUTPUT AMPLITUDE VOLTAGE LEVEL SHIFTING CIRCUIT

BACKGROUND OF THE INVENTION

1. Field of the Invention

The present invention relates to a voltage level shifting circuit for amplifying the voltage of a signal of the ECL level or other small voltage amplitude to change it to a signal of a large amplitude.

2. Description of the Related Art

FIG. 1 is a circuit diagram of a first example of the configuration of a conventional voltage level shifting circuit.

This voltage level shifting circuit 10 is configured as a flipflop circuit comprised of a first inverter including a resistor 1 and an n-channel MOS transistor 7 connected at one end and a drain thereof, respectively, and a second invertor including a resistor 2 and an n-channel MOS transistor 8 connected at one end and a drain thereof, respectively, with the inputs and the outputs of the inverters connected cross-wise.

More specifically, a connection point between one end of the resistor 1 forming the output of the first inverter and the drain of the n-channel MOS transistor 7 is connected with the gate of the n-MOS transistor 8 forming the input of the second inverter, while a connection point between one end of the resistor 2 forming the output of the second inverter and the drain of the n-channel MOS transistor 8 is connected with the gate of the n-channel MOS transistor 7 forming the input of the first inverter.

Also, input terminals 3 and 4 are constituted by the connection points with the supply lines of the power supply voltage of the inverters, that is, the other ends of the resistors 1 and 2. A variable power supply voltage is input to the input terminals 3 and 4 as the input signals $V_{in1}$ and $V_{in2}$.

The flipflop of the voltage level shifting circuit constituted in this way, as shown in FIG. 2, has two stabilization points a and b in the case where the input signals $V_{in1}$ and $V_{in2}$ are the same level.

Further, by giving a slight amplitude difference $\Delta V_{in}$ between the input signals $V_{in1}$ and $V_{in2}$, the flipflop is made unstable in a state as shown by the broken line of FIG. 2. If there is only one stabilization point, that is, the point shown by c, the operation point shifts to that stabilization point c.

By reversing the stabilization point of the flipflop by a slight change of the input voltage, a large output amplitude can be obtained.

FIG. 3 is a circuit diagram of a second example of the configuration of a conventional voltage level shifting circuit, while FIG. 4 shows the output characteristics of the circuit of FIG. 3.

This circuit uses the p-channel MOS transistors 24 and 23 instead of the n-channel MOS transistors of FIG. 1 and the positions of the MOS transistors and the resistors 21 and 22 are reversed.

In this case too, variable power supply voltages are used as the input signals. The basic operation, like with that of the circuit of FIG. 1, is one which uses a slight amplitude difference $\Delta V_{in}$ between the input signals $V_{in1b}$ and $V_{in2b}$ and reverses the stabilization point of the flipflop to obtain a large output amplitude.

FIG. 5 is a circuit diagram of a third example of the configuration of a conventional voltage level shifting circuit, while FIG. 6 shows the output characteristics (butterfly-plots) of the circuit of FIG. 5.

This circuit uses the p-channel MOS transistors 41 and 42 as loads instead of the load resistors of FIG. 1 and connects the gates of the p-channel MOS transistors 41 and 42 to the input terminals 45 and 46.

The basic operation is similar to that of the circuit of FIG. 1 and FIG. 2. A slight amplitude difference $\Delta V_{in}$ between the input signals $V_{in1b}$ and $V_{in2b}$ is used to reverse the stabilization point of the flipflop to obtain a large output amplitude.

However, in the above-mentioned conventional circuits, direct current (DC) is consumed, so it is necessary to increase the DC current in order to increase the drive capacity.

Further, to invert the output, a certain magnitude of input amplitude is required. Further, there is the problem that the output amplitude is not a full swing one.

SUMMARY OF THE INVENTION

The present invention has as its object to provide a voltage level shifting circuit which can realize high sensitivity input, high speed, and large output amplitude with a low power consumption.

To achieve the above and other objects, the voltage level shifting circuit of the present invention comprises a voltage level shifting unit, comprising of two inverters with inputs and outputs connected cross-wise and transfer gates connected to one of the power side connection terminals of the two inverters, the transfer gates operatively connecting the signal source and connection terminals of the inverters in accordance with the input of the clock signals.

Further, the voltage level shifting circuit of the present invention has a means for setting the potential of the two output terminals of the voltage level shifting unit to the same level.

According to the present invention, the two transfer gates are held in an OFF state by the same clock signals. At this time, the inverter outputs of the voltage level shifting unit are for example at the ground level and the voltage level shifting unit comprised by the two inverters is inactive.

Here, for example, a first signal of the $V_{cc}$ level and a second signal of the ($V_{cc}-\Delta V$) level, giving a predetermined level difference $\Delta V$, are input to the input terminals of the transfer gates. Also, the transfer gates are switched from the OFF to the ON state by the clock signals.

At this instant, the stabilization point changes and one inverter output stabilizes at the $V_{cc}$ level, while the other inverter output becomes the ground level and a large output amplitude of close to a full swing is obtained.

Further, according to the present invention, the potentials of the two output terminals of the voltage level shifting unit are set to the same potential. Due to this, the previous data is reset at a high speed and the next data can be sensed with a short clock pulse width.

BRIEF DESCRIPTION OF THE DRAWINGS

These and other objects and features of the present invention will become more apparent from the following description of the preferred embodiments made with reference to the drawings, in which.

DESCRIPTION OF THE PREFERRED EMBODIMENTS

A presently preferred embodiment of the present invention will now be explained in detail with reference to the drawings.

Figure 1:
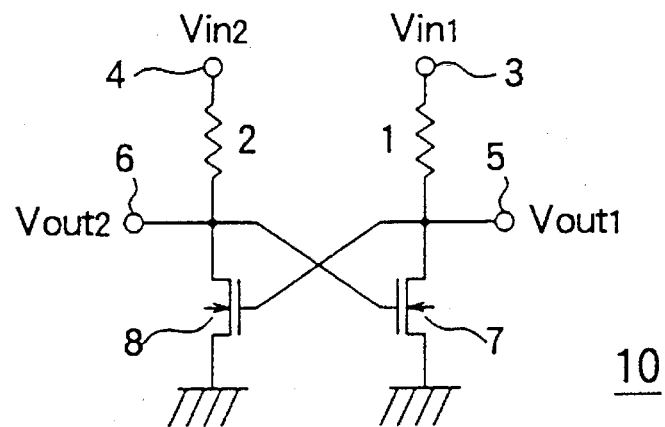
FIG. 1 is a circuit diagram of a first example of the configuration of a voltage level shifting circuit of the related art.
Figure 2:
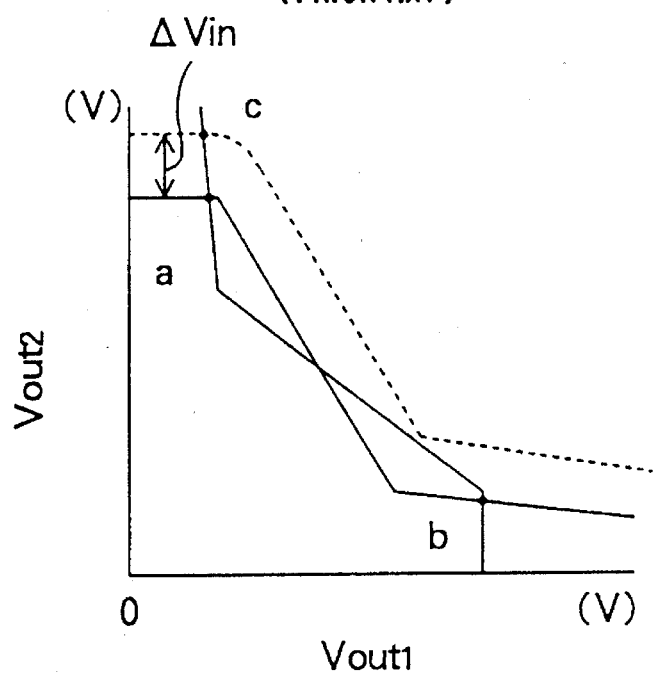
FIG. 2 is a view (butterfly plot) of the output characteristics of the circuit of FIG. 1.
Figure 3:
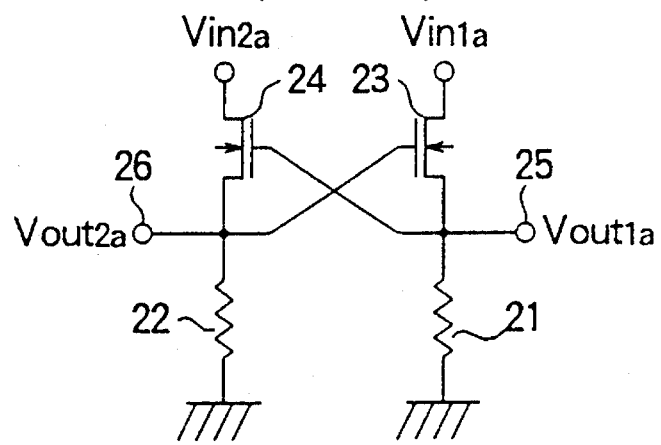
FIG. 3 is a circuit diagram of a second example of the configuration of a voltage level shifting circuit of the related art.
Figure 4:
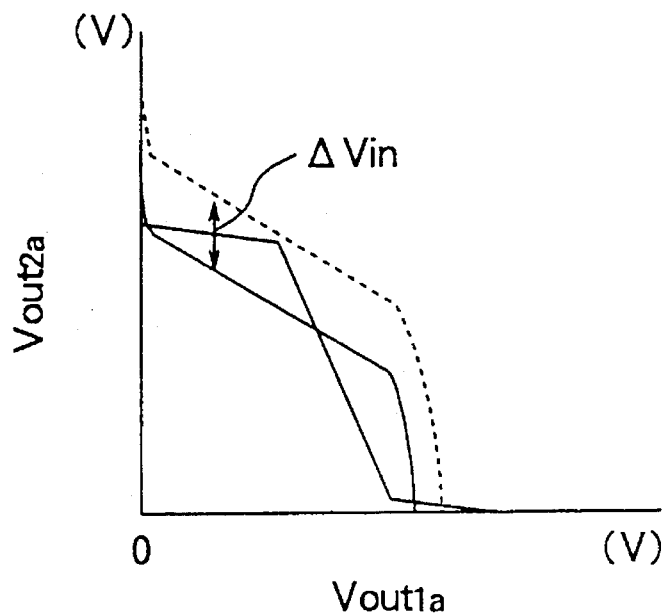
FIG. 4 is a view (butterfly plot) of the output characteristics of the circuit of FIG. 3.
Figure 5:
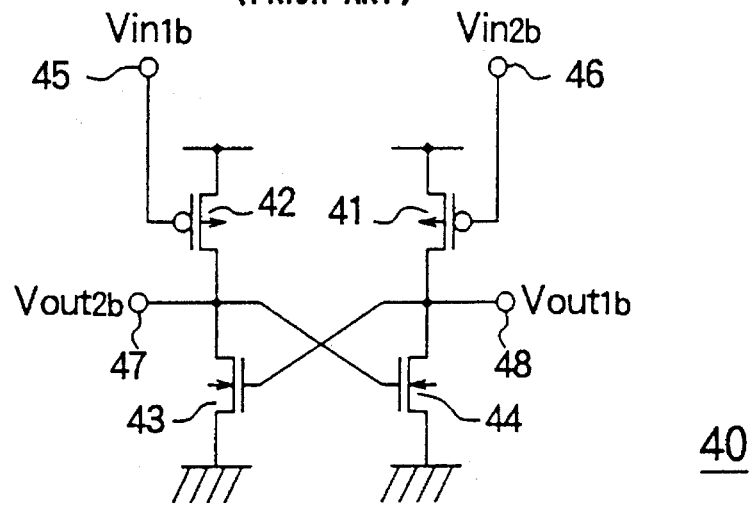
FIG. 5 is a circuit diagram of a third example of the configuration of a voltage level shifting circuit of the related art.
Figure 6:
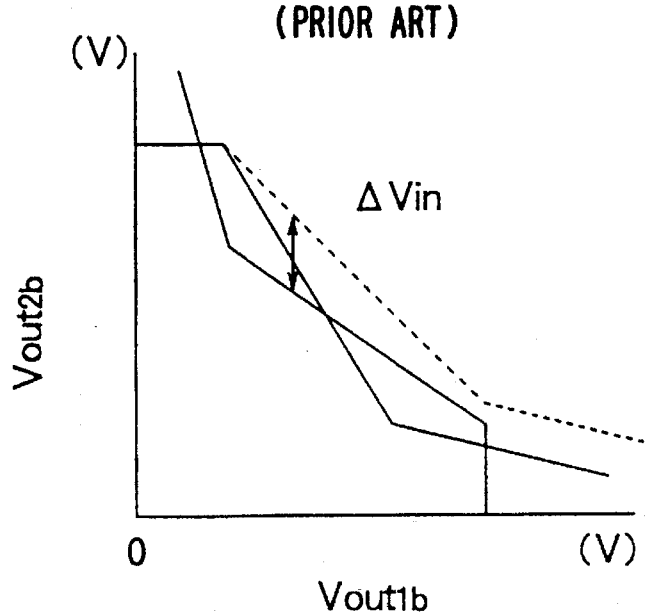
FIG. 6 is a view (butterfly plot) of the output characteristic of the circuit of FIG. 5.
Figure 7:
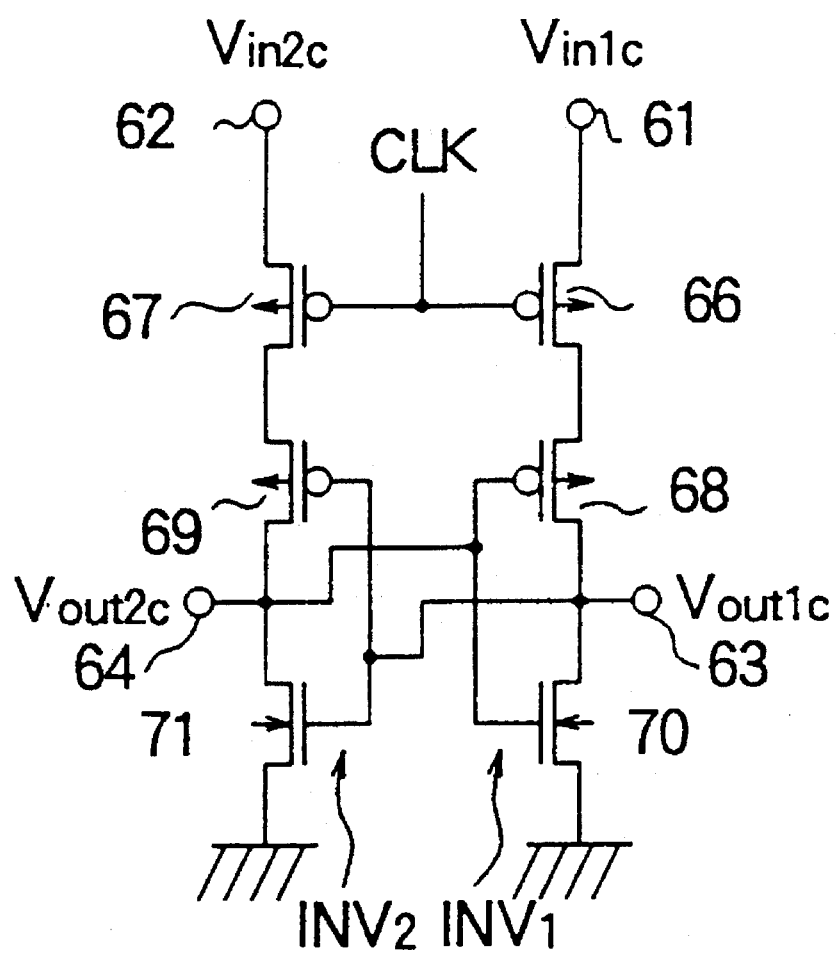
FIG. 7 is a circuit diagram of a first embodiment of a voltage level shifting circuit according to the present invention.

FIG. 7 is a circuit diagram of a first embodiment of the voltage level shifting circuit according to the present invention.

In FIG. 7, $V_{in1c}$ and $V_{in2c}$ represent input signals, $V_{out1c}$ and $V_{out2c}$ represent output signals, 61 and 62 represent input terminals, 63 and 64 represent output terminals, $INV_1$ represents a first complementary metal oxide semiconductor (CMOS) inverter, $INV_2$ represents a second CMOS inverter, and $TFG_1$ and $TFG_2$ represent transfer gates 66 and 67 respectively.

The first CMOS inverter $INV_1$ is comprised of an n-channel MOS transistor 70 and a p-channel MOS transistor 68 connected at their drains and at their gates. The source of the n-channel MOS transistor 70 is grounded, while the source of the p-channel MOS transistor 68 is connected to one of the input-output terminals of the transfer gate 66.

The second CMOS inverter $INV_2$ is comprised of an n-channel MOS transistor 71 and a p-channel MOS transistor 69 with their drains and their gates mutually connected. The source of the n-channel MOS transistor 71 is grounded, while the source of the p-channel MOS transistor 69 is connected to one of the input-output terminals of the transfer gate 67.

The first and second CMOS inverters $INV_1$ and $INV_2$ having this construction are connected cross-wise in their inputs and outputs and constitute a flipflop.

More specifically, the connection point of the drains of the first CMOS inverter $INV_1$ output, that is, the n-channel MOS transistor 70, and the p-channel MOS transistor 68 is connected to the connection point of the gates of the input of the second CMOS inverter $INV_2$, that is, the n-channel MOS transistor 71, and the p-channel MOS transistor 69, while the connection point of the drains of the second CMOS inverter $INV_2$ output, that is, the n-channel MOS transistor 71, and the p-channel MOS transistor 69 is connected to the connection point of the gates of the input of the first CMOS inverter $INV_1$, that is, the n-channel MOS transistor 70, and the p-channel MOS transistor 68.

The transfer gates 66 and 67 are comprised of p-channel MOS transistors. The gates of the two transfer gates 66 and 67 are connected to the input line of the clock signals CLK, which is active level when it is low level (ground level).

Further, the other input-output terminal of the transfer gates 66 is connected to the input terminal 61 of the input signal $V_{in1c}$, while the other input-output terminal of the transfer gate 67 is connected to the input terminal 62 of the input signal $V_{in2c}$.

In this way, this voltage level shifting circuit is basically comprised of a flipflop comprised of two CMOS inverters connected cross-wise. The reason for this will be explained with reference to FIG. 8 and FIG. 9.

Figure 8A:
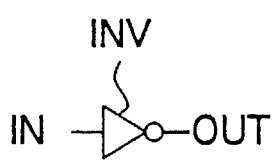
FIG. 8, comprised of FIGS. 8A–8B, is a view of the input-output characteristic of a CMOS inverter.
Figure 8B:
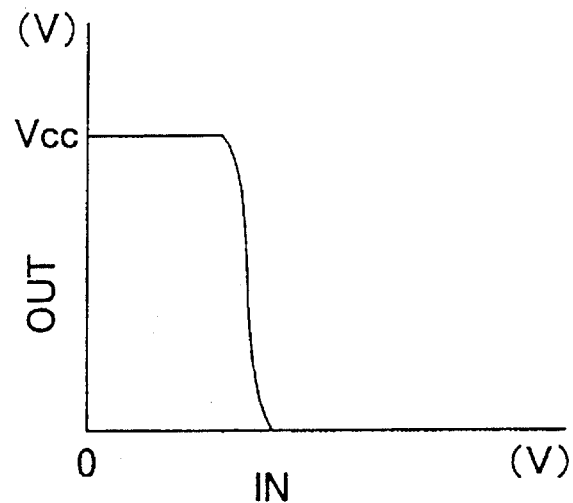

The input-output characteristic of one CMOS inverter INV shown in FIG. 8A, as shown in FIG. 8B, is one in which the output OUT becomes the $V_{cc}$ level when the input IN is the ground level (0 V) and the output OUT becomes the ground level when the input IN is the $V_{cc}$ level.

Figure 9A:
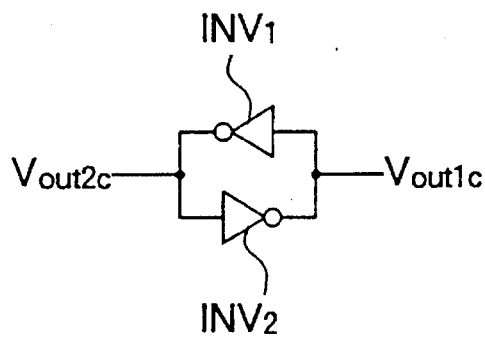
FIG. 9, comprised of FIGS. 9A–9B, is a view (butterfly plot) of the output characteristic of the flipflop comprised using CMOS inverters.
Figure 9B:
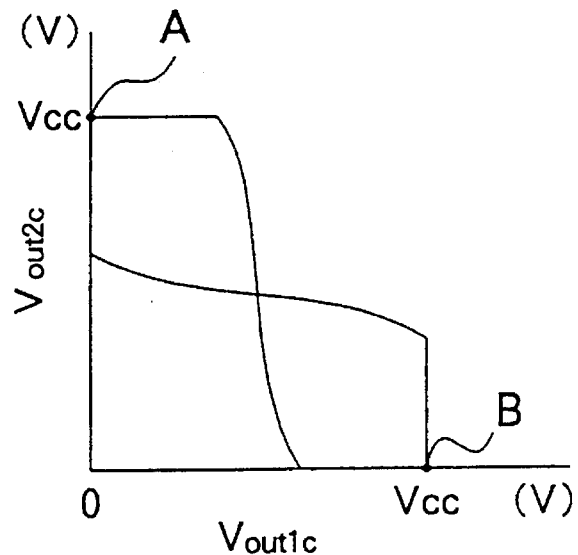

By using two CMOS inverters having such input-output characteristics, connecting the input and outputs of the same, and thereby constituting a flipflop as shown in FIG. 9A, the stabilization points A and B are present at substantially the $V_{cc}$ and ground level as shown in FIG. 9B and the output is full swing.

Figure 10:
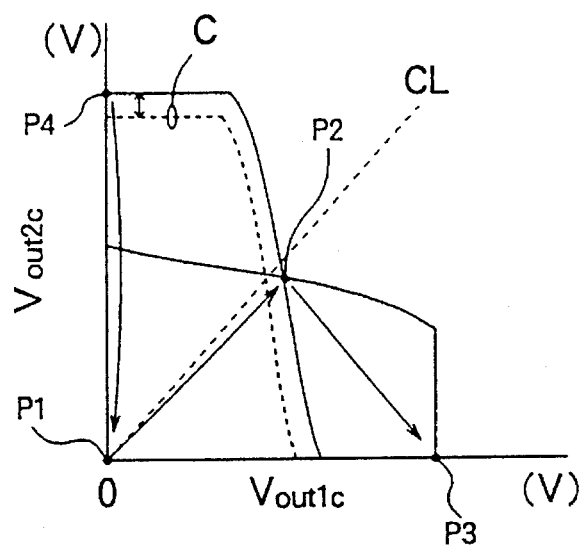
FIG. 10 is a view (butterfly plot) of the output characteristic of the circuit of FIG. 7.
Figure 11:
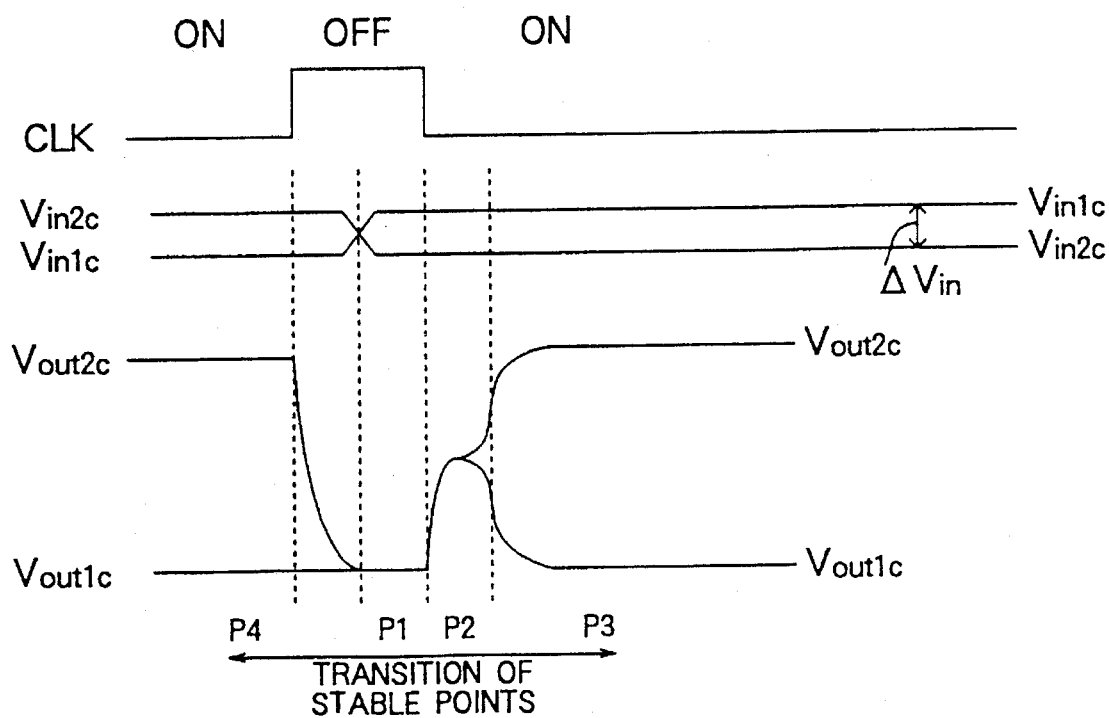
FIG. 11 is a timing chart of the circuit of FIG. 7.

FIG. 10 is a view (butterfly plot) showing the output characteristic of the voltage level shifting circuit of FIG. 7 using the CMOS inverters with these characteristics, while FIG. 11 is a timing chart of the same.

Next, an explanation will be made of the operation of the circuit of FIG. 7 using FIG. 10 and FIG. 11 and focusing on the change of the stabilization point.

First, when the clock signal CLK is the Vcc level (OFF state), the transfer gates 66 and 67 are held in the OFF state.

At this time, as shown in FIG. 11, the output signals $V_{out1c}$ and $V_{out2c}$ are at the ground level, the flipflop comprised by the CMOS inverter $INV_1$ and $INV_2$ is in an inactive state, and the stabilization point is at the position of P1 as shown in FIG. 10 and FIG. 11.

Here, the input signal $V_{in1}$ is the $V_{cc}$ level and is input to the input terminal 61, while the input signal $V_{in2c}$ is ($V_{cc}$ − $\Delta V_{in}$) and is input to the input terminal 62. When the clock signal CLK is switched from the $V_{cc}$ level to the ground level, the transfer gates 66 and 62 switch from the OFF state to the ON state.

At this instant, the stabilization point changes from P1 to

P2. The prior stabilization point P2 corresponds to the point of intersection of the butterfly plot, but is an unstable point, so the circuit tends to shift to stabilization point P3 or stabilization point P4.

The stabilization point P2, as mentioned above, is off somewhat from the center line CL as shown in FIG. 10 since an amplitude difference exists between signals $V_{in1c}$ and $V_{in2c}$. In this example, the stabilization point P2 will tend to changes to the closer stabilization point P3.

As a result, the level of the output signal $V_{out1}$ becomes the $V_{cc}$ level and the output signal $V_{out2}$ becomes the ground level. That is, a large output amplitude can be obtained.

As explained above, according to the present embodiment, a flipflop is comprised by the two CMOS inverters $INV_1$ and $INV_2$, the power supply voltage sides of the CMOS inverters $INV_1$ and $INV_2$ are used as the inputs of the signals $V_{in1}$ and $V_{in2}$, transfer gates 66 and 67 are connected between the input terminals 6 and 62 of the input signals $V_{in1}$ and $V_{in2}$ and the input terminals of the CMOS inverters $INV_1$ and $INV_2$, respectively, and the transfer gates 66 and 67 are turned OFF/ON by the same clock signals CLK, so alternating current is consumed only at the time of transition of the clock signal CLK and no direct current flows, so low power consumption is achieved.

Further, the high level side of the output becomes the high input voltage, while the low level side becomes the ground level. If the input voltage is the $V_{cc}$ level, an output of a full swing (wide range) from ground level to $V_{cc}$ is obtained and a large output amplitude close to full swing is obtained.

Further, if the flipflop is completely balanced, sensing is possible no matter how small the output amplitude. In this way, while the actual input sensitivity depends on the balance of the flipflop, it is possible to obtain an extremely high input sensitivity.

Figure 12:
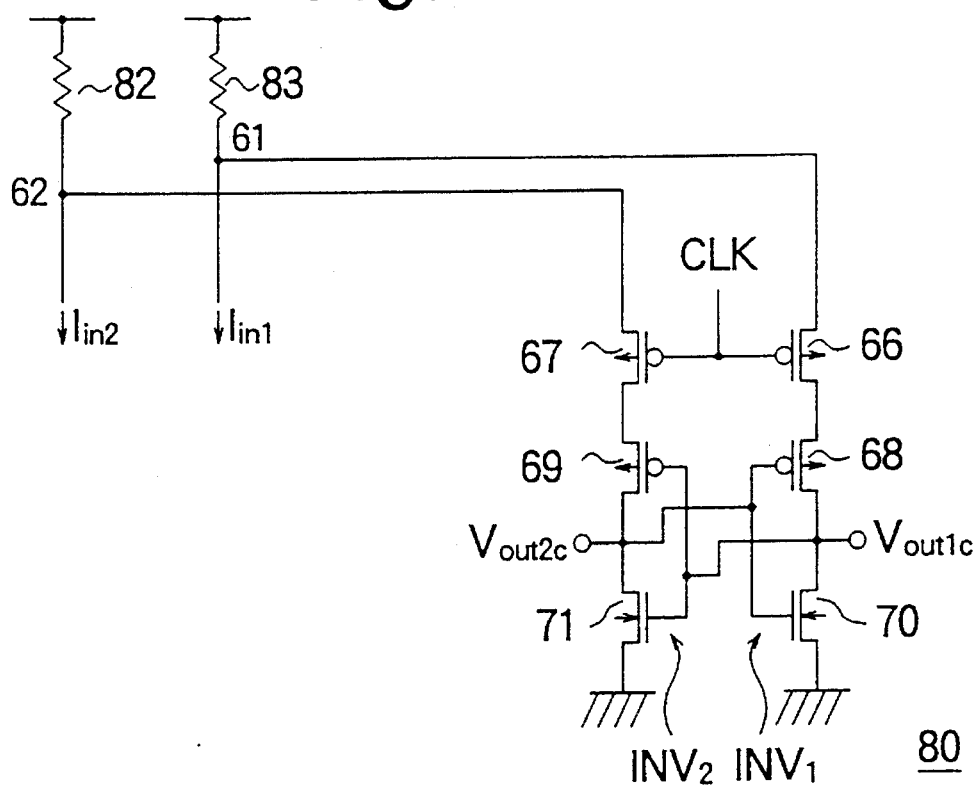
FIG. 12 is a circuit diagram of an example of use of the circuit of FIG. 7 which shows an example of use in the case of sensing a current difference.
Figure 13:
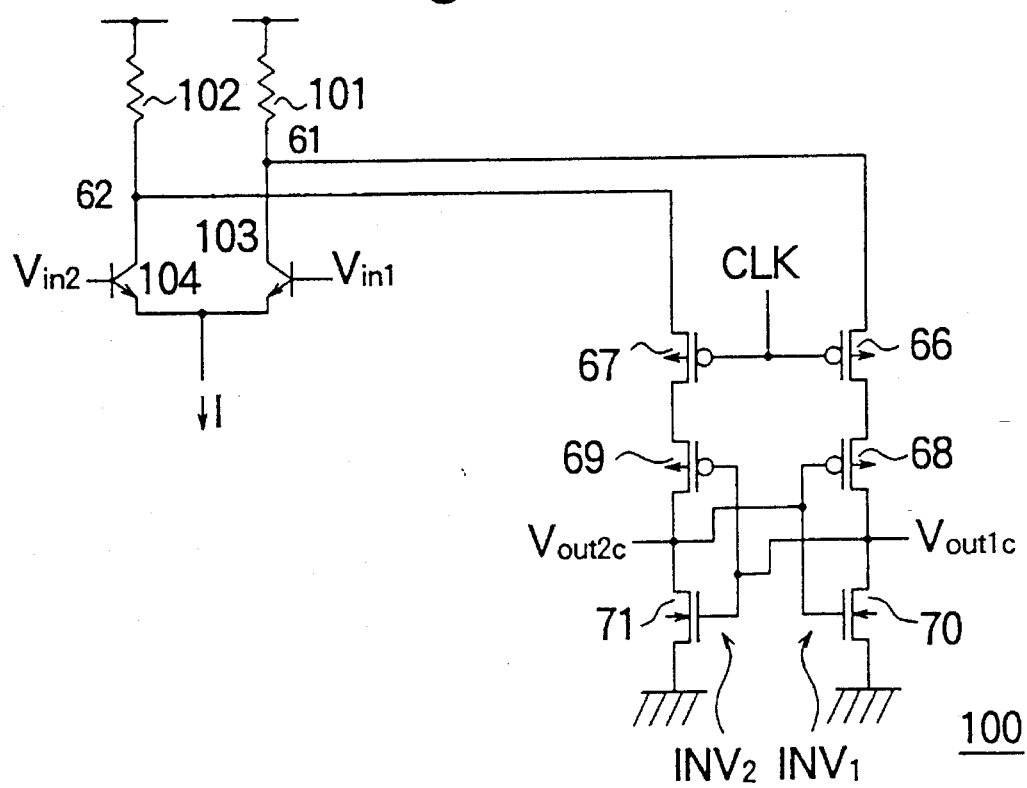
FIG. 13 is a circuit diagram of an example of use of the circuit of FIG. 7 which shows an example of use combined with a sense amplifier.

FIG. 12 and FIG. 13 are circuit diagrams of examples of specific applications of voltage level shifting circuits 80 and 100 respectively using the principles of the circuit of FIG. 7.

The circuit shown in FIG. 12 is one which senses the difference of the currents $I_{in1}$ and $I_{in2}$ and operates as a so-called current sense amplifier.

The currents $I_{in1}$ and $I_{in2}$ are converted to voltage levels by the resistors 81 and 82 and input to the transfer gates 66 and 67.

The circuit shown in FIG. 13 is a combination of the voltage level shifting circuit of FIG. 7 with a sense amplifier.

In this case, the input signals $V_{in1}$ and $V_{in2}$ are input to the bases of the differential pair constituted by the npn transistors 103 and 104. This input level difference is input through the npn transistors 103 and 104 to the transfer gates 66 and 67.

The voltage level shifting circuit of FIG. 7 is not suitably applicable for sensing the differential input between the reference voltage, and the intermediate potential between the voltage $V_{cc}$ and the ground, but effective voltage level shifting becomes possible by combining it with a sense amplifier in this way.

Figure 14:
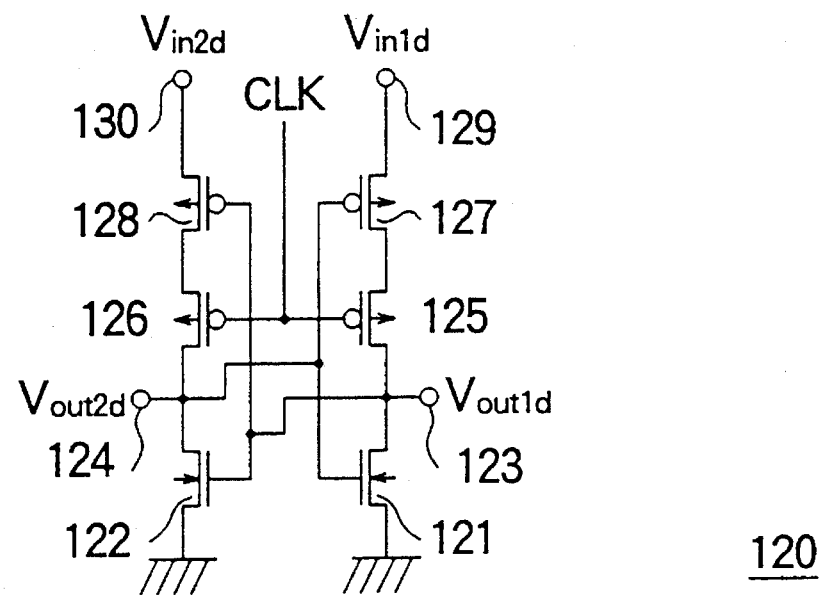
FIG. 14 is a circuit diagram of a second embodiment of the voltage level shifting circuit according to the present invention.

FIG. 14 is a circuit diagram of a second embodiment of a voltage level shifting circuit 120 according to the present invention.

The differences of this embodiment with the first embodiment are that instead of the transfer gates 125 and 126 being connected to the direct input terminals 129 and 130, they are connected between the p-channel MOS transistor 127 and n-channel MOS transistor 121 constituting the CMOS inverter $INV_1$ and between the p-channel MOS transistor 128 and n-channel MOS transistor 122 constituting the CMOS inverter $INV_2$, respectively.

Even with this configuration, similar effects can be obtained as with the above-mentioned first embodiment.

Figure 15:
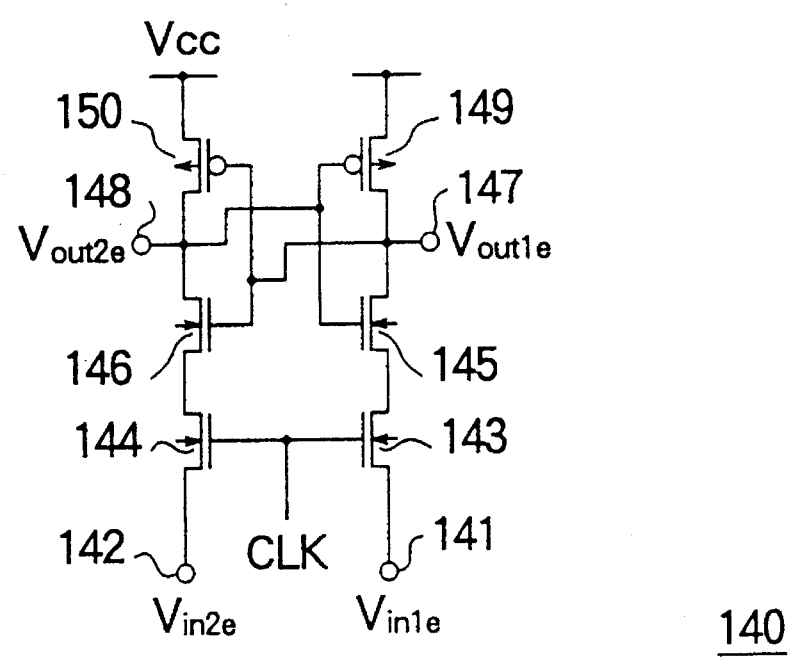
FIG. 15 is a circuit diagram of a third embodiment of the voltage level shifting circuit according to the present invention.

FIG. 15 is a circuit diagram of a third embodiment of the voltage level shifting circuit 140 according to the present invention.

The difference of this embodiment from the first embodiment is that the transfer gate is comprised by an n-channel MOS transistor instead of being comprised by a p-channel MOS transistor.

In this case, the transfer gates 143 and 144 comprised of the n-channel MOS transistors are connected to connection terminals with the ground, not to the connection terminal side of the CMOS inverters $INV_1$ and $INV_2$ with the power supply voltage $V_{cc}$. More specifically, the transfer gates 143 and 144 are connected to the source sides of the n-channel MOS transistors 145 and 146, and the same clock signals CLK are input to the gates of the transfer gates 143 and 144.

Even with this configuration, similar effects can be obtained as with the above-mentioned first embodiment.

Figure 16:
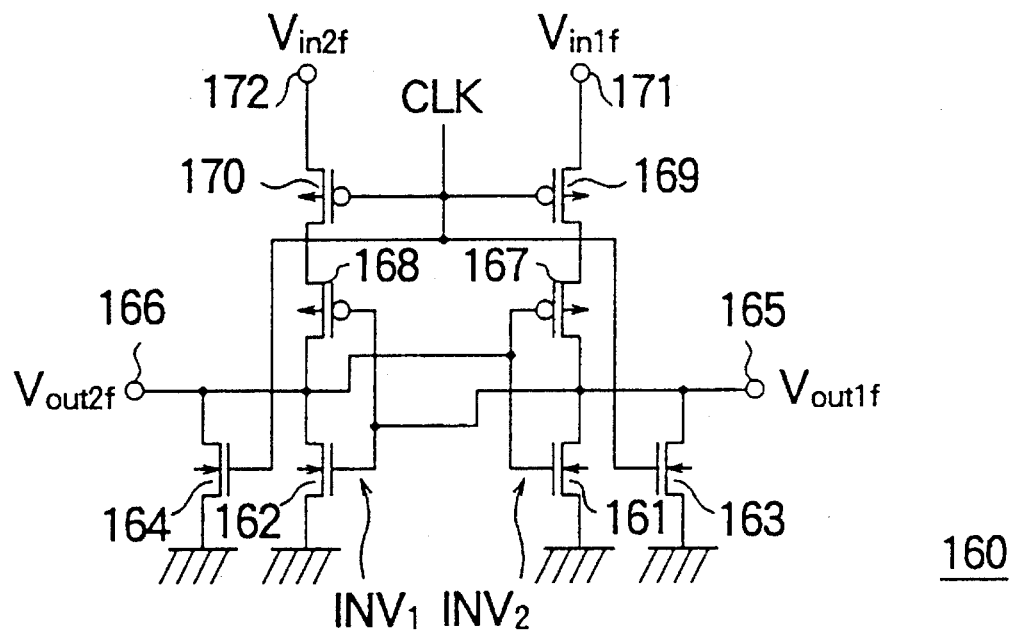
FIG. 16 is a circuit diagram of a fourth embodiment of the voltage level shifting circuit according to the present invention.

FIG. 16 is a circuit diagram of a fourth embodiment of the voltage level shifting circuit 160 according to the present invention.

The differences of this embodiment from the first embodiment are that n-channel MOS transistors 163 and 164 are connected between the output terminal 165 and the ground and between the output terminal 166 and the ground, respectively, and the gates of the n-channel MOS transistors 163 and 164 are connected to the input lines of the clock signals CLK.

In this embodiment, by providing the n-channel MOS transistors 163 and 164, the output terminals 165 and 166 are made settable to the same potential, that is, the ground potential, in accordance with the input of the clock signals CLK.

By adopting this configuration, there is the following advantage in addition to the effects of the first embodiment.

That is, by connecting the n-channel MOS transistors 163 and 164 between the output terminals 165 and 166 and the ground, high speed resetting of the previous data becomes possible and sensing of the next data even with a short clock pulse width becomes possible.

Figure 17:
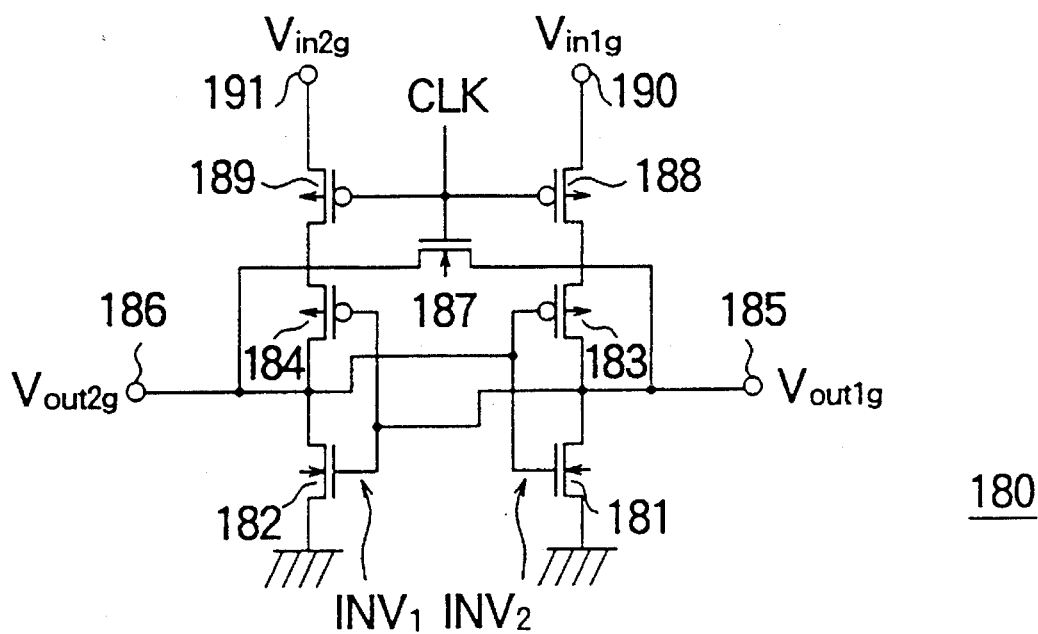
FIG. 17 is a circuit diagram of a fifth embodiment of the voltage level shifting circuit 180 according to the present invention.

FIG. 17 is a circuit diagram of a fifth embodiment of the voltage level shifting circuit 180 according to the present invention.

The differences of this embodiment from the fourth embodiment are that as the means for setting the potential of the output terminals 185 and 186 to the same level, instead of providing the n-channel MOS transistors 163 and 164 for setting the output terminals 185 and 186 to the ground level, the equalizing n-channel MOS transistor 187 is connected in parallel between the output terminals 185 and 186 and the gate of the n-channel MOS transistor 187 is connected to the input line of the clock signals CLK.

In this configuration as well, the output terminals 185 and 186 may be shorted and held at the same potential in accordance with the input of the clock signals CLK and, in the same way as the above-mentioned fourth embodiment, the data can be reset at a high speed and the next data can be set even with a short clock pulse width.

As explained above, according to the present invention, DC power is not consumed, so the power consumption can be reduced and, also, there are no restrictions on the consumed current, so the drive capacity can be made larger.

Further, it is possible to obtain an extremely high input sensitivity and obtain an output amplitude close to full swing.

What is claimed is:

1. A voltage level shifting circuit comprising:
 a voltage level shifting unit including a pair of inverters each having a power side connection terminal and having their respective inputs and output terminals connected cross-wise; and
 a pair of transfer gates, each connected to the power side connection terminal of said inverters and to a signal source, said transfer gates being responsive to an input clock signal to selectively connect said signal sources and said power side connection terminals of said inverters.

2. A voltage level shifting circuit as set forth in claim 1, further comprising a means for setting the potential of the output terminals of said voltage level shifting unit to the same level.

3. A voltage level shifting circuit as set forth in claim 1, further comprising a potential setting means connected between the output terminals and the power side connection terminal of said inverters.

4. A voltage level shifting circuit as set forth in claim 3, wherein said potential setting means is responsive to said clock signals.

5. A voltage level shifting circuit comprising first and second inverters, each comprising first and second conductivity type transistors connected in series, each of said first and second conductivity type transistors having an input terminal and an output terminal with output of the first conductivity type transistor of one of said inverters and the input terminals of the first and second conductivity type transistors of the other inventer being commonly connected, each of said inverters being responsive to an input signal to generate an output and further comprising a pair of second transistors, each having an input terminal, said second transistors being response to a control signal fed to the inputs thereof to control the input to said inverters.

* * * * *